US012796107B2

(12) United States Patent
Gou et al.

(10) Patent No.: US 12,796,107 B2
(45) Date of Patent: Nov. 10, 2026

(54) DEVICE ISOLATION STRUCTURE AND MANUFACTURING METHOD THEREOF, AND SEMICONDUCTOR DEVICE

(71) Applicant: HUAWEI DIGITAL POWER TECHNOLOGIES CO., LTD., Shenzhen (CN)

(72) Inventors: Peng Gou, Shanghai (CN); Can Zhong, Shenzhen (CN); Fengjie Tang, Dongguan (CN); Xiran Zuo, Shanghai (CN); Ming Pan, Shenzhen (CN); Liu Yuan, Dongguan (CN); Tianyi Zhang, Shenzhen (CN); Guidong Jin, Shenzhen (CN); Yanjun Chen, Shenzhen (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 302 days.

(21) Appl. No.: 18/780,202

(22) Filed: Jul. 22, 2024

(65) Prior Publication Data

US 2024/0379651 A1 Nov. 14, 2024

Related U.S. Application Data

(63) Continuation of application No. PCT/CN2022/114684, filed on Aug. 25, 2022.

(30) Foreign Application Priority Data

Jan. 24, 2022 (CN) ........................ 202210082284.8

(51) Int. Cl.
*H10D 89/10* (2025.01)
*H10D 84/40* (2025.01)
(Continued)

(52) U.S. Cl.
CPC ........... *H10D 89/10* (2025.01); *H10D 84/401* (2025.01); *H10P 90/1908* (2026.01); *H10W 10/181* (2026.01)

(58) Field of Classification Search
CPC .. H10D 89/10; H10D 84/401; H10P 90/1908; H10W 10/181
See application file for complete search history.

(56) References Cited

U.S. PATENT DOCUMENTS

| | | | |
|---|---|---|---|
| 5,268,312 | A | 12/1993 | Reuss et al. |
| 2010/0032769 | A1 | 2/2010 | Hao et al. |

FOREIGN PATENT DOCUMENTS

| | | | |
|---|---|---|---|
| CN | 1941373 | A | 4/2007 |
| CN | 101964329 | A | 2/2011 |

(Continued)

OTHER PUBLICATIONS

International Search Report and Written Opinion in International Appln. No. PCT/CN2022/114684, mailed on Nov. 7, 2022, 15 pages (with English translation).

(Continued)

*Primary Examiner* — Samuel A Gebremariam
(74) *Attorney, Agent, or Firm* — Fish & Richardson P.C.

(57) ABSTRACT

An example manufacturing method includes performing first ion implantation into a first area of a substrate to form a buried layer. Second ion implantation into a second area of the substrate is performed to form a pre-dopant, where the second area is disposed around a periphery of the first area, and a thermal diffusion capability of ions in the pre-dopant is higher than a thermal diffusion capability of ions at the buried layer. An epitaxial layer is formed on a side, of the substrate, on which the buried layer and the pre-dopant are disposed. Third ion implantation into the epitaxial layer is performed, in correspondence to the second area, to form a deep well. Thermal annealing is performed to thermally
(Continued)

diffuse ions at the buried layer, in the pre-dopant, and in the deep well.

14 Claims, 8 Drawing Sheets

(51) Int. Cl.
*H10P 90/00* (2026.01)
*H10W 10/10* (2026.01)

(56) References Cited

FOREIGN PATENT DOCUMENTS

| | | | |
|---|---|---|---|
| CN | 102306661 | A | 1/2012 |
| CN | 202134578 | U | 2/2012 |
| CN | 102569045 | A | 7/2012 |
| CN | 104347420 | B | 6/2018 |
| CN | 209993601 | U | 1/2020 |
| CN | 114530412 | A | 5/2022 |

OTHER PUBLICATIONS

Antoniadis et al., "Diffusion of Substitutional Impurities in Silicon at Short Oxidation Time: An Insight into Point Defect Kinetics," Journal of Applied Physics, Oct. 1982, 53(10):9 pages.
Extended European Search Report in European Appln. No. 22921479.6, mailed on Jun. 5, 2026, 12 pages.

Thickness of an epitaxial layer=12 μm

Thickness of an epitaxial layer=12 μm

DEVICE ISOLATION STRUCTURE AND MANUFACTURING METHOD THEREOF, AND SEMICONDUCTOR DEVICE

CROSS-REFERENCE TO RELATED APPLICATIONS

This application is a continuation of International Application No. PCT/CN2022/114684, filed on Aug. 25, 2022, which claims priority to Chinese Patent Application No. 202210082284.8, filed on Jan. 24, 2022. The disclosures of the aforementioned applications are hereby incorporated by reference in their entireties.

TECHNICAL FIELD

This application relates to the technical field of integrated circuits, and in particular, to a device isolation structure and a manufacturing method thereof, and a semiconductor device.

BACKGROUND

Bipolar-CMOS-DMOS (BCD) is a process for integrating a bipolar junction transistor (BJT), a complementary metal oxide semiconductor (CMOS), and a double-diffused metal-oxide semiconductor (DMOS) on one chip. The BCD is compatible with both a high-voltage device and a low-voltage device, to obtain a power integrated circuit with low power consumption and high performance, and can be extensively applied to a power management chip, AC/DC conversion, automobile electronics, industrial control, and the like.

Isolation of the high-voltage device from the low-voltage device and a breakdown voltage of a lateral double-diffused metal-oxide semiconductor (LDMOS) device are focuses of the BCD process, and are also key factors to device performance. In BCD, a buried layer process is an important technical means for implementing device isolation and the breakdown voltage. Specifically, a buried layer is first formed generally through ion implantation into a substrate, and then the buried layer is covered through epitaxial growth. Then, a buried layer extraction structure, for example, a deep well, is formed through ion implantation into an epitaxial layer. An internal area surrounded by the deep well and the buried layer that are connected is formed as a device area. A core device, for example, the high-voltage device, is disposed in the device area at the epitaxial layer, and the low-voltage device may be disposed in an area on an outer side of the device area at the epitaxial layer, to isolate the high-voltage device from the low-voltage device. Regardless of a function of the buried layer, the buried layer needs to be extracted, to apply a required bias voltage to the deep well and the buried layer by using a metal electrode.

In the conventional technology, with an increase of a thickness of the epitaxial layer, a circuit disconnection is prone to occur between the deep well and the buried layer, and consequently, the buried layer cannot be extracted, and the high-voltage device and the low-voltage device cannot be effectively isolated; or with an increase of a thickness of the epitaxial layer, an existing process is greatly changed, and the process becomes more complicated, causing much higher costs of the process and a longer manufacturing cycle.

SUMMARY

Embodiments of this application provide a device isolation structure and a manufacturing method thereof, and a semiconductor device. With an increase of a thickness of an epitaxial layer, a buried layer can be smoothly extracted, to effectively isolate a high-voltage device from a low-voltage device and be well compatible with an existing process, thereby helping reduce processing costs and shorten a manufacturing cycle.

Therefore, the following technical solutions are used in embodiments of this application:

According to a first aspect, an embodiment of this application provides a method for manufacturing a device isolation structure. The method for manufacturing a device isolation structure includes: performing first ion implantation into a first area of a substrate to form a buried layer; performing second ion implantation into a second area of the substrate to form a pre-dopant, where the second area is disposed around a periphery of the first area, and a thermal diffusion capability of ions in the pre-dopant is higher than a thermal diffusion capability of ions at the buried layer; forming an epitaxial layer on a side, of the substrate, on which the buried layer and the pre-dopant are disposed; performing, in correspondence to the second area, third ion implantation into the epitaxial layer to form a deep well; and performing thermal annealing, to thermally diffuse ions at the buried layer, in the pre-dopant, and in the deep well, so that the buried layer, the pre-dopant, and the deep well are sequentially connected, where an internal area surrounded by the buried layer, the pre-dopant, and the deep well is a device area.

According to the method for manufacturing the device isolation structure in this embodiment of this application, the pre-dopant is formed at the periphery of the buried layer, and the thermal diffusion capability of ions in the pre-dopant is higher than the thermal diffusion capability of ions at the buried layer, so that when the epitaxial layer is thick, after thermal annealing, ions at the buried layer, in the pre-dopant, and in the deep well are thermally diffused, and therefore the buried layer, the pre-dopant, and the deep well are sequentially connected. The internal area surrounded by the buried layer, the pre-dopant, and the deep well is the device area in which, for example, a high-voltage device may be disposed, and a low-voltage device may be disposed on an outer side, of the deep well, away from the device area. Because the buried layer is successfully extracted through the pre-dopant and the deep well, a metal electrode can be used to apply a required bias voltage to the deep well, the pre-dopant, and the buried layer, to effectively isolate the high-voltage device from the low-voltage device with a slight change to an existing process and be well compatible with the existing process, thereby helping reduce processing costs and shorten a manufacturing cycle.

In a possible implementation, the ions at the buried layer are the same as the ions in the pre-dopant, and an ion concentration in the pre-dopant is greater than an ion concentration at the buried layer; or the ions at the buried layer are different from the ions in the pre-dopant, where the thermal diffusion capability of the ions in the pre-dopant is higher than the thermal diffusion capability of the ions at the buried layer, and an ion concentration in the pre-dopant is greater than, less than, or equal to an ion concentration at the buried layer; or the thermal diffusion capability of the ions in the pre-dopant is lower than the thermal diffusion capability of the ions at the buried layer, and an ion concentration in the pre-dopant is greater than an ion concentration at the buried layer. To be specific, in this implementation, to ensure that the thermal diffusion capability of the ions in the pre-dopant is higher than the thermal diffusion capability of the ions at the buried layer, types and concentrations of the ions at the buried layer and in the pre-dopant may be, but are not limited to, the following manners. In a manner 1, the ions at the buried layer are the same as the ions in the pre-dopant, and the ion concentration in the pre-dopant is greater than the ion concentration at the buried layer. In a manner 2, the ions at the buried layer are different from the ions in the pre-dopant, and the thermal diffusion capability of the ions in the pre-dopant is higher than the thermal diffusion capability of the ions at the buried layer. In this case, the ion concentration in the pre-dopant may be greater than the ion concentration at the buried layer, or may be less than the ion concentration at the buried layer, or may be equal to the ion concentration at the buried layer. In a manner 3, the ions at the buried layer are different from the ions in the pre-dopant, the thermal diffusion capability of the ions in the pre-dopant is lower than the thermal diffusion capability of the ions at the buried layer, and the ion concentration in the pre-dopant is greater than the ion concentration at the buried layer.

In a possible implementation, before a step of performing second ion implantation into a second area of the substrate to form a pre-dopant, the method further includes: determining, on the substrate, the second area by using a mask, where a position of the second area is marked on the mask. To be specific, in this implementation, the position of the second area may be marked by using the mask. Specifically, a first photoresist layer is disposed on the substrate, the mask with a target pattern is laid on the first photoresist layer, and exposure and development processes are performed, to form the target pattern on the first photoresist layer and obtain a patterned first photoresist layer. The target pattern includes a shape of the second area, so that the position of the second area is determined on the substrate.

In a possible implementation, before a step of performing, in correspondence to the second area, third ion implantation into the epitaxial layer to form a deep well, the method further includes: determining, at the epitaxial layer, the second area by using the mask. To be specific, in this implementation, the mask for determining the position of the second area at the epitaxial layer and the mask for determining the position of the second area of the substrate may be the same. In this way, no extra mask and thermal budget costs are required. Specifically, a second photoresist layer may be disposed at the epitaxial layer. The mask with the target pattern is laid on the second photoresist layer, and exposure and development processes are performed, so that the target pattern is formed on the second photoresist layer, to form a patterned second photoresist layer. The target pattern includes the shape of the second area, so that the position of the second area is determined at the epitaxial layer.

In a possible implementation, the performing second ion implantation into a second area of the substrate to form a pre-dopant includes: performing, in a transverse direction at a specified distance from the buried layer, the second ion implantation into the second area to form the pre-dopant; or performing, in a transverse direction in contact with the buried layer, the second ion implantation into the second area to form the pre-dopant. To be specific, in this implementation, because the thermal diffusion capability of the ions in the pre-dopant is higher than the thermal diffusion capability of the ions at the buried layer, before thermal annealing, the pre-dopant may be spaced from the buried layer at the specified distance. In this way, a dosage of the second ion implantation can be reduced, and production costs can be reduced. After thermal annealing, the ions in the pre-dopant and the ions at the buried layer are thermally diffused, so that the pre-dopant is connected to the buried layer. Alternatively, to ensure that the pre-dopant and the buried layer can be reliably connected after thermal annealing, before thermal annealing, the pre-dopant and the buried layer may be in contact with each other, and the pre-dopant and the buried layer may overlap each other as needed.

In a possible implementation, the performing, in correspondence to the second area, third ion implantation into the epitaxial layer to form a deep well includes: performing the third ion implantation into the second area at the epitaxial layer until there is a specified distance from the pre-dopant in a longitudinal direction, to form the deep well; or performing the third ion implantation into the second area at the epitaxial layer until the deep well is contact with the pre-dopant in a longitudinal direction, to form the deep well. To be specific, in this implementation, because the thermal diffusion capability of the ions in the pre-dopant is higher than the thermal diffusion capability of the ions at the buried layer, before thermal annealing, the deep well may be spaced from the pre-dopant at a specified distance. In this way, when the epitaxial layer is thick, energy for the third ion implantation for forming the deep well can be lower, and an extra high-energy ion implantation machine is not needed. The ion implantation can be implemented by using an existing machine. In addition, a dosage of the third ion implantation can be reduced to some extent, helping reduce production costs. After thermal annealing, the ions in the pre-dopant and the ions in the deep well are thermally diffused, so that the pre-dopant is connected to the deep well. Alternatively, to ensure that the pre-dopant and the deep well can be reliably connected after thermal annealing, before thermal annealing, the pre-dopant and the deep well may be in contact with each other, and the pre-dopant and the deep well may overlap each other as needed.

In a possible implementation, that the buried layer, the pre-dopant, and the deep well are sequentially connected includes: connecting the pre-dopant to the buried layer in the transverse direction; and connecting the deep well and the pre-dopant in the longitudinal direction. To be specific, in this implementation, the pre-dopant and the buried layer are mainly connected in the transverse direction, and the deep well and the pre-dopant are mainly connected in the longitudinal direction, so that the buried layer, the pre-dopant, and the deep well are sequentially connected, to ensure that the buried layer is smoothly extracted through the pre-dopant and the deep well, thereby effectively isolating the high-voltage device from the low-voltage device.

In a possible implementation, the substrate is of a first conductivity type, the buried layer, the pre-dopant, and the deep well are of a second conductivity type, and the epitaxial layer is of the first conductivity type or the second conductivity type. The first conductivity type is contrary to the second conductivity type. To be specific, in this implementation, a conductivity type of the substrate may be contrary to a conductivity type of the buried layer, the pre-dopant, and the deep well, and a conductivity type of the epitaxial layer may be the same as or contrary to the conductivity type of the substrate. For example, the conductivity type of the substrate may be a P type, the conductivity type of the buried layer, the pre-dopant, and the deep well may be an N type, and the conductivity type of the epitaxial layer may be the P type or the N type.

According to a second aspect, an embodiment of this application provides a device isolation structure. The device isolation structure includes: a substrate, having a first area and a second area, where the second area is disposed around a periphery of the first area; a buried layer is formed through first ion implantation into the first area, a pre-dopant is formed through second ion implantation into the second area, and a thermal diffusion capability of ions in the pre-dopant is higher than a thermal diffusion capability of ions at the buried layer; and an epitaxial layer, located on a side, of the substrate, on which the buried layer and the pre-dopant are disposed, where a deep well is formed, in correspondence to the second area, through third ion implantation into the epitaxial layer, where the buried layer, the pre-dopant, and the deep well are sequentially connected, and an internal area surrounded by the buried layer, the pre-dopant, and the deep well is a device area.

In a possible implementation, the ions at the buried layer are the same as the ions in the pre-dopant, and an ion concentration in the pre-dopant is greater than an ion concentration at the buried layer; or the ions at the buried layer are different from the ions in the pre-dopant, where the thermal diffusion capability of the ions in the pre-dopant is higher than the thermal diffusion capability of the ions at the buried layer, and an ion concentration in the pre-dopant is greater than, less than, or equal to an ion concentration at the buried layer; or the thermal diffusion capability of the ions in the pre-dopant is lower than the thermal diffusion capability of the ions at the buried layer, and an ion concentration in the pre-dopant is greater than an ion concentration at the buried layer.

In a possible implementation, the substrate is of a first conductivity type, the buried layer, the pre-dopant, and the deep well are of a second conductivity type, and the epitaxial layer is of the first conductivity type or the second conductivity type, where the first conductivity type is contrary to the second conductivity type; and/or the buried layer, the pre-dopant, and the deep well are disposed as follows: before thermal annealing, the pre-dopant and the deep well are disposed apart or in contact in a longitudinal direction, and the buried layer and the pre-dopant are disposed apart or in contact in a transverse direction; and after thermal annealing, ions at the buried layer, in the pre-dopant, and in the deep well are thermally diffused, so that the pre-dopant is connected to the buried layer in the transverse direction, and the deep well is connected to the pre-dopant in the longitudinal direction.

According to a third aspect, an embodiment of this application provides a semiconductor device. The semiconductor device includes the device isolation structure according to the second aspect; a high-voltage device, disposed in a device area of the device isolation structure; and a low-voltage device, disposed at the epitaxial layer and located on an outer side, of the deep well, away from the device area.

Other features and advantages of the present invention are described in detail in the description of embodiments.

BRIEF DESCRIPTION OF DRAWINGS

The accompanying drawings that need to be used for describing embodiments or the conventional technology are described briefly below.

FIG. 9 is a schematic diagram of a sectional view of a structure of the device isolation structure according to an embodiment of this application before thermal annealing, and FIG. 10 is a schematic diagram of a sectional view of a structure of the device isolation structure shown in FIG. 9 after thermal annealing.

DESCRIPTION OF EMBODIMENTS

Figure 1:
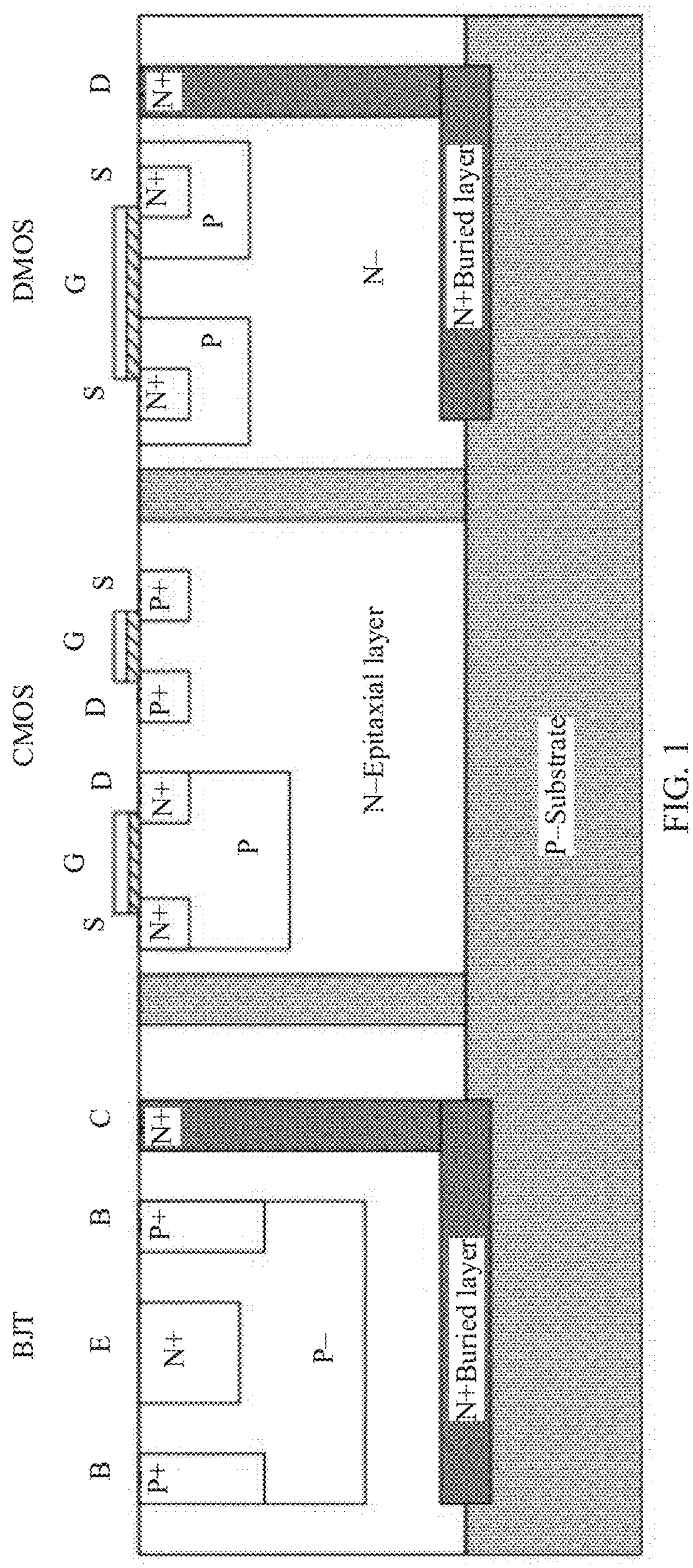
FIG. 1 is a schematic diagram of a sectional view of a structure of an LDMOS device.

Technical solutions in embodiments of this application are described below with reference to the accompanying drawings in embodiments of this application.

In descriptions of this application, locations or location relationships indicated by terms "center", "up", "down", "front", "behind", "left", "right", "vertical", "horizontal", "top", "bottom", "inner", "outer", and the like are based on locations or location relationships shown in the accompanying drawings, and are merely intended for ease of describing this application and simplifying descriptions, instead of indicating or implying that a mentioned apparatus or element needs to be provided on a specific location or constructed and operated on a specific location, and therefore shall not be understood as limitations on this application.

In the descriptions of this application, it should be noted that, unless otherwise clearly specified and limited, terms "mount", "link", and "connect" should be understood in a broad sense, for example, may mean a fixed connection, may be a detachable connection, or may be a butt joint connection or an integrated connection. A person of ordinary skill in the art can understand specific meanings of the foregoing terms in this application based on specific cases.

Abbreviations and key terms used in embodiments of this application are described below in detail.

TCAD: technology computer-aided design, that is, process design with assistance of a computer.

Mask: referred to as a reticle or a mask. In a process of manufacturing an integrated circuit (IC), a photoetching technology is used to form a pattern on a semiconductor. To copy the pattern on a wafer, a principle of a mask is needed. Like when a photo is developed, an image is copied to a photo by using a negative.

Ion implantation: A material modification method for implanting ions of a dopant into a solid. Simply speaking, a process of ion implantation is to irradiate (implant) accelerated, to-be-doped ions of atoms into a solid material in a vacuum system, to form a surface layer (implantation layer) with a special property in a selected (that is, an implanted) area.

SOI: silicon-on-insulator, that is, silicon on an insulating substrate, a buried oxide layer introduced between the silicon at the top and the substrate at the bottom. By forming a semiconductor film on an insulator, the SOI material has an advantage that bulk silicon cannot compare to. For example, dielectric isolation of a component in an integrated circuit can be implemented, and a parasitic latch-up effect in a bulk silicon CMOS circuit is completely eliminated. An integrated circuit made of this material further has advantages such as a small parasitic capacitance, a high integration density, a high speed, a simple process, a slight short-channel effect, and particular applicability to a low-voltage and low-power circuit. Therefore, it can be considered that SOI may become a mainstream technology for deep submicron low-voltage and low-power integrated circuits.

It should be noted that embodiments in this application and features in embodiments may be mutually combined when there is no conflict. This application is described in detail below with reference to the accompanying drawings in conjunction with embodiments.

FIG. 1 is a schematic diagram of a sectional view of a structure of an LDMOS device. As shown in FIG. 1, a BJT, a CMOS, and a DMOS are integrated together. A substrate is of a P type, and a buried layer and an epitaxial layer are of an N type. The BJT and the CMOS may be used as low-voltage devices, and the DMOS may be used as a high-voltage device. In order to isolate the high-voltage device from the low-voltage devices, a deep well, that is, a buried layer extraction structure, is connected to the buried layer. The buried layer is mainly used to isolate the high-voltage device from the low-voltage devices, and the buried layer becomes a collector of a parasitic triode, to avoid a current flowing towards or flowing out from the substrate when a bipolar transistor is triggered. In addition, regardless of a function of the buried layer, the buried layer needs to be extracted, to apply a required bias voltage to the deep well and the buried layer by using a metal electrode.

With a higher requirement on a breakdown voltage of a device, especially of a bulk silicon LDMOS device with a voltage greater than 150 V (although an SOI device may be used for implementation, costs are high), a transverse breakdown voltage of the device may be implemented by extending a drift area of the device. However, the breakdown voltage of the device is usually limited by a longitudinal breakdown voltage. There are a plurality of methods for improving the longitudinal breakdown voltage. However, for a high-voltage BCD platform, a thickness of an epitaxial layer of a substrate needs to be increased for the improvement. For example, a thickness of an epitaxial layer of a 100 V LDMOS device is about 8 μm, and a thickness of an epitaxial layer of an above-150 V device needs to be greater than 12 μm. However, an increase of the thickness of the epitaxial layer causes difficult extraction of the isolation buried layer, and the device cannot be completely isolated. This is because the buried layer needs to be connected to ion implantation extraction to form an effective protection ring for electric isolation. If a potential cannot be added to the buried layer, the floating buried layer cannot have an isolating effect. As a result, a maximum breakdown voltage of the high-voltage device is greatly limited. Therefore, extraction of a deep isolation buried layer of a high-voltage bulk silicon device is an urgent problem to be solved in a process for manufacturing a device isolation structure.

With reference to FIG. 2 to FIG. 5, several buried layer extraction solutions used in a process of manufacturing a device isolation structure are described below.

Figure 2:
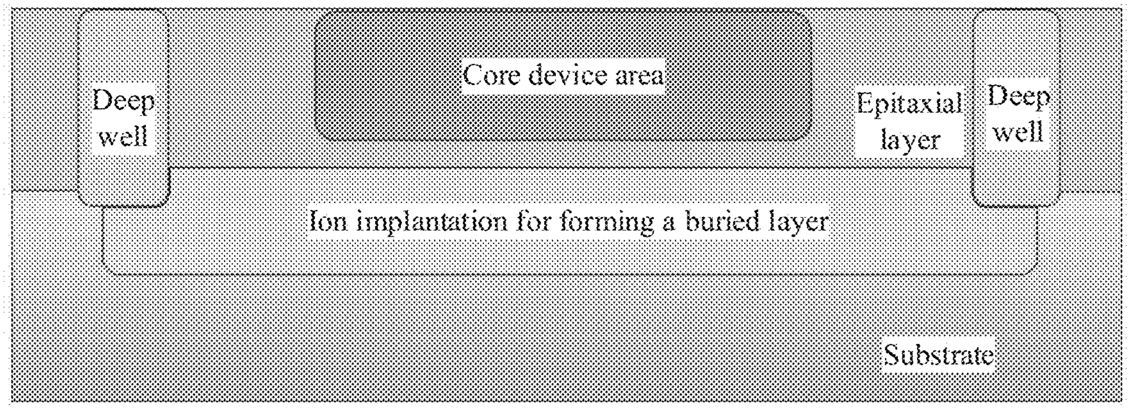
FIG. 2 is a schematic diagram of a sectional view of a structure of a device isolation structure after thermal annealing.

FIG. 2 is a schematic diagram of a sectional view of a structure of a device isolation structure after thermal annealing. As shown in FIG. 2, the device isolation structure uses a conventional buried layer extraction solution. Specifically, ion implantation for forming a buried layer is first performed on a substrate, and then substrate epitaxial growth is performed. After epitaxy of a device is completed, high-energy ion implantation is performed at an epitaxial layer to form a deep well. For example, the deep well is formed through direct ion implantation that is of a same type as that for forming the buried layer, and is in contact with the ion implantation for forming the buried layer. The deep well is connected to the buried layer through thermal annealing, to extract the buried layer.

As the buried layer is extracted through ion implantation for forming the deep well after epitaxy of the device, the buried layer can be extracted when the epitaxial layer is thin. However, as a thickness of the epitaxial layer is increased, a capability of an existing ion implantation machine cannot satisfy a requirement on the ion implantation for forming the deep well, and after thermal diffusion, the ion implantation for forming the deep well cannot be in contact with the buried layer. As a result, a circuit disconnection occurs, and the buried layer cannot be extracted.

Figure 3A:
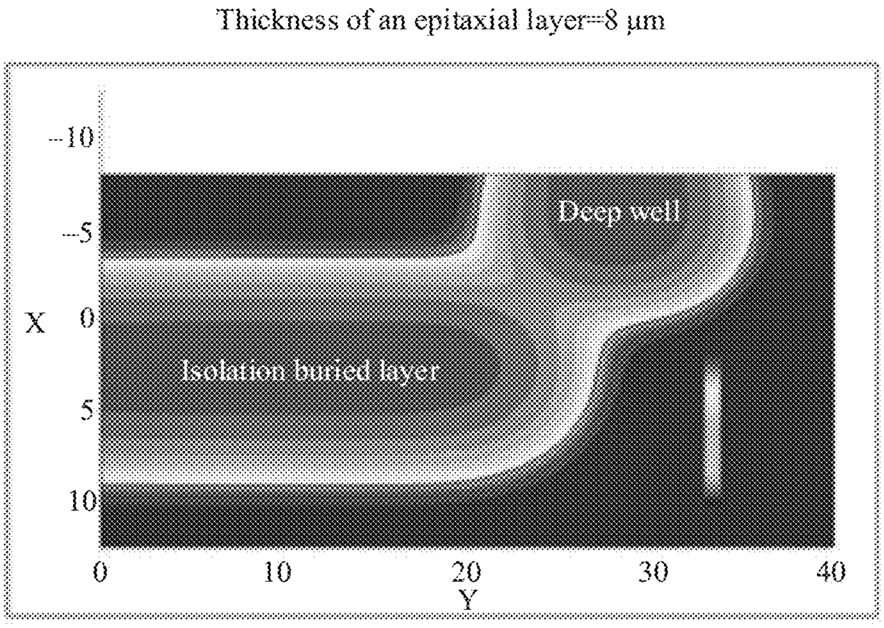
FIG. 3A is a simulation diagram of a TCAD process on the device isolation structure shown in FIG. 2 after thermal annealing.

FIG. 3A is a simulation diagram of a TCAD process on the device isolation structure shown in FIG. 2 after thermal annealing. As shown in FIG. 3A, it can be clearly seen through a TCAD process simulation that when the thickness of the epitaxial layer is 8 μm, the isolation buried layer can be extracted through the deep well.

In addition, in simulation diagrams of the TCAD process shown in FIG. 3A and those in FIG. 3B and FIG. 11 that are to be described below, a rectangular bar graphic symbol at a lower-right corner indicates that a P-type dopant dosage/dopant concentration gradually increases from the middle to the bottom, and an N-type dopant dosage/dopant concentration gradually increases from the middle to the top.

Figure 3B:
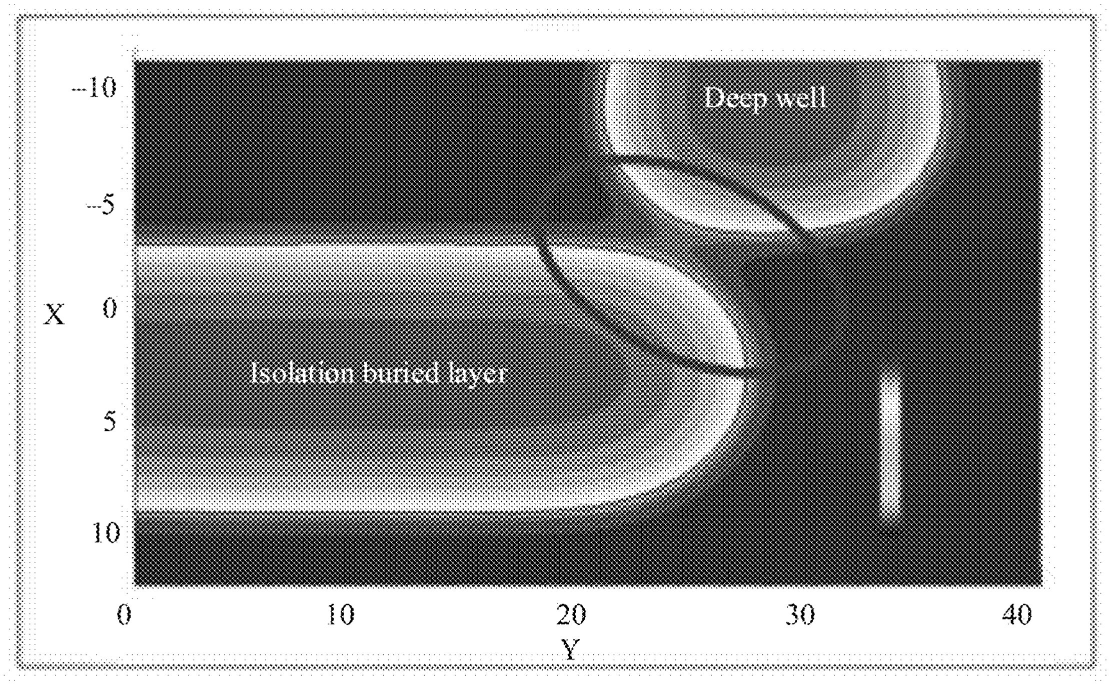
FIG. 3B is a simulation diagram of a TCAD process after an epitaxial layer of the device isolation structure shown in FIG. 2 is enlarged and thermal annealing is performed.

FIG. 3B is a simulation diagram of a TCAD process after the epitaxial layer of the device isolation structure shown in FIG. 2 is enlarged and thermal annealing is performed. As shown in FIG. 3B, when the thickness of the epitaxial layer is increased to 12 μm, there is a spacing between the isolation buried layer and the extracted ion implantation, that is, the deep well, and the buried layer cannot be extracted. Only if an ion implantation machine with higher implantation energy is used to deepen the extracted ion implantation, the buried layer can be contacted. However, this will greatly increase costs.

Figure 4:
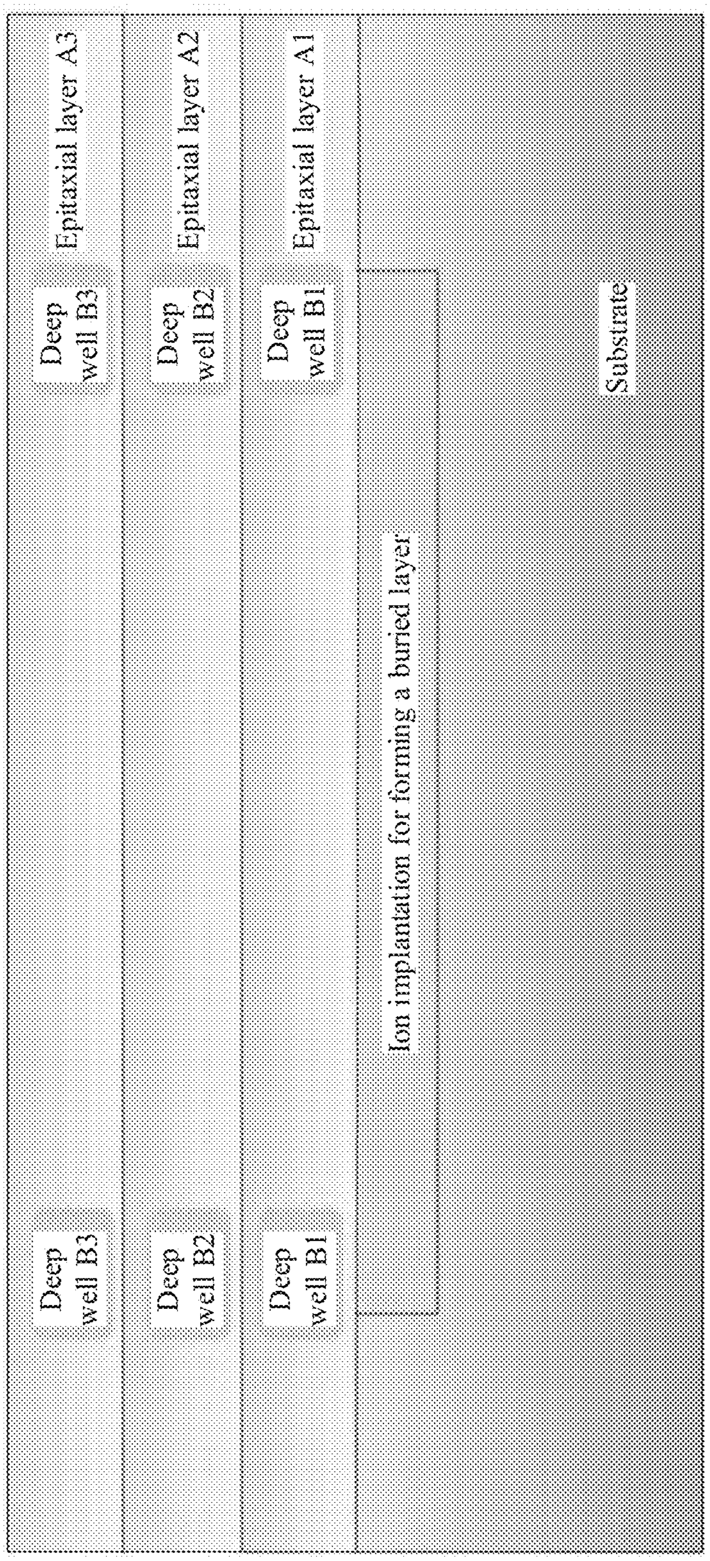
FIG. 4 is a schematic diagram of a sectional view of a structure of another device isolation structure before thermal annealing.

FIG. 4 is a schematic diagram of a sectional view of a structure of another device isolation structure before thermal annealing. As shown in FIG. 4, both epitaxy and ion implantation are performed for a plurality of times on the device isolation structure. After thermal diffusion, extraction of ion implantation for forming a deep well may be in contact with a buried layer, to extract the deep isolation buried layer. Specifically, ion implantation for forming the buried layer is first performed on a substrate, a part of an epitaxial layer is then grown, and the ion implantation for forming the deep well is then performed immediately. Then, epitaxial growth and the ion implantation for forming the deep well are performed alternately until the epitaxial layer has a suitable thickness. In FIG. 4, an epitaxial layer A1, a deep well B1, an epitaxial layer A2, a deep well B2, an epitaxial layer A3, and a deep well B3 are formed. After thermal annealing is performed finally, each ion implantation for forming the deep well is connected to the buried layer through diffusion.

In the foregoing solution in which both the epitaxy and the ion implantation are performed for the plurality of times for extracting the buried layer, as the epitaxial growth is an important part of costs of a BCD process, and the plurality of times of epitaxial growth greatly increase the costs of the process, and increase complexity of the process. In addition, the plurality of times of epitaxial growth also greatly prolong a manufacturing cycle.

Figure 5:
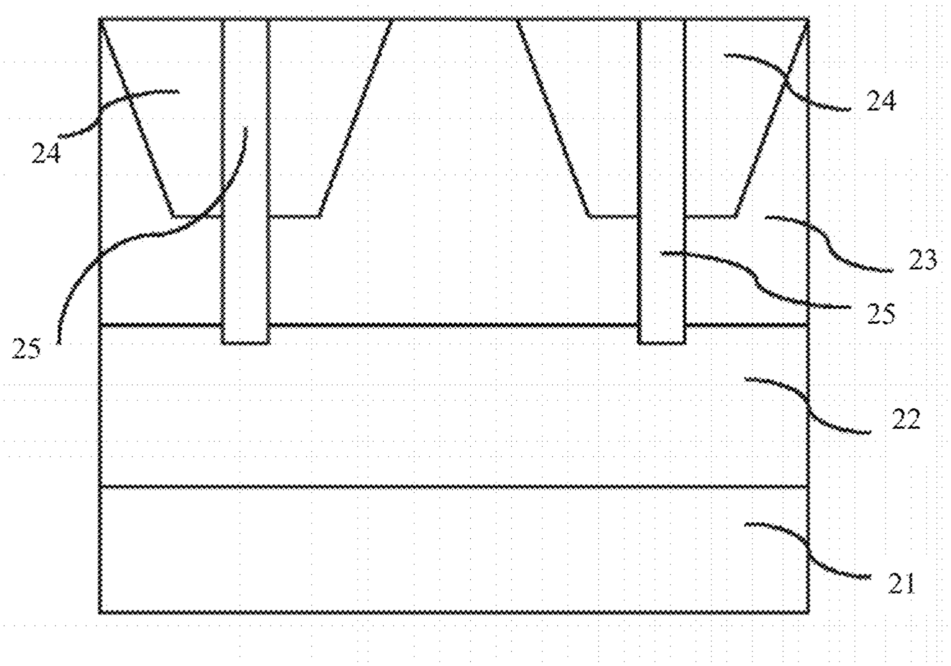
FIG. 5 is a schematic diagram of a sectional view of a structure of a still another device isolation structure.

FIG. 5 is a schematic diagram of a sectional view of a structure of a still another device isolation structure. As shown in FIG. 5, a doping area 22 is formed on a semiconductor substrate (usually a silicon substrate) 21 through an ion implantation process. A doping type of the doping area 22 is contrary to that of the substrate 21. A single crystal epitaxial layer 23 is grown above the doping area 22 through an epitaxy process. In this case, the doping area 22 becomes a buried layer 22. An isolation area 24 is fabricated at the epitaxial layer 23. The isolation area 24 is a dielectric material, and is preferably silicon oxide. A doping type of the epitaxial layer 23 is the same as that of the substrate 21.

A through hole is etched in the isolation area 24, and the bottom of the through hole is in contact with the buried layer 22. Then, the through hole is filled with metal to form a contact hole electrode 25. Specifically, etching is first performed in the isolation area to form a first part of the through hole, where a stop layer is located on a boundary surface between the isolation area 24 and the epitaxial layer 23. Then, the epitaxial layer 23 is etched to form a second part of the through hole until the buried layer 22 is contacted. Finally, tungsten is deposited to form the contact hole electrode 25, and eventually the buried layer is extracted.

Because the epitaxial layer is thick, in this solution, the through hole needs to be etched to reach an area of the buried layer. This presents a high requirement on an etching process with increased costs of the process. In addition, it is difficult to distinguish the boundary surface between the epitaxial layer 23 and the buried layer 22, and consequently, there is no stop layer for etching to form the second part of the through hole, and a depth of etching is not easy to control. Finally, tungsten is deposited in the through hole, and this easily causes a hollow and a poor contact.

It can be learned from the foregoing three solutions shown in FIG. 2 to FIG. 5 that, when the high-voltage power device is fully isolated by using a buried layer or applies a substrate bias voltage applied by using the buried layer, the thickness of the epitaxial layer is increased. Consequently, the deep isolation buried layer cannot be smoothly extracted, the breakdown voltage of the device is limited, and the device cannot work normally; or there is a higher processing difficulty, and this is not good for reducing the costs and shortening the manufacturing cycle.

In view of this, embodiments of this application provide a device isolation structure and a manufacturing method thereof, and a semiconductor device. When an epitaxial layer is thick, ion implantation is performed on a substrate to form a pre-dopant, and ion implantation is then performed to form a deep well. In this way, after thermal annealing, a buried layer, the pre-dopant, and the deep well can be reliably connected, so that the deep buried layer of a high-voltage device can be extracted, and the high-voltage device can be effectively isolated from a low-voltage device. In addition, this process method is uncomplicated and easy to implement without an extra mask, and may be implemented based on a capability of an existing machine without extra machine costs. An existing process is merely slightly modified, and the process can be well compatible with the existing process, thereby helping reduce processing costs and shorten a manufacturing cycle.

In addition, the method for extracting a deep isolation buried layer is applicable to extraction of an isolation buried layer for any device, for example, isolating a high-voltage device from a low-voltage device; or isolating different high-voltage devices as needed. In this application, isolation of a high-voltage device from a low-voltage device is mainly used as an example for description.

Figure 6:
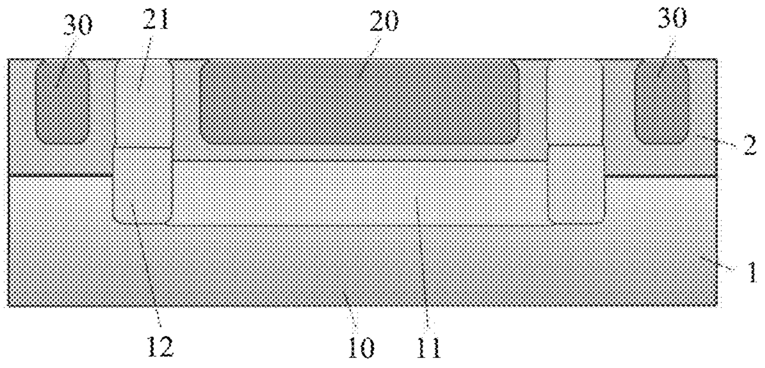
FIG. 6 is a schematic diagram of a sectional view of a structure of a semiconductor device according to an embodiment of this application.

FIG. 6 is a schematic diagram of a sectional view of a structure of a semiconductor device according to an embodiment of this application. As shown in FIG. 6, the semiconductor device includes a device isolation structure 10, a high-voltage device 20, and a low-voltage device 30. The high-voltage device 20 is disposed in a device area of the device isolation structure 10. An internal area surrounded by a buried layer 11, a pre-dopant 12, and a deep well 21 is the device area. The low-voltage device 30 is disposed at an epitaxial layer 2 and located on an outer side of the device area. In addition, both the pre-dopant 12 and the deep well 21 are generally enclosed-ring structures. In this way, after the deep well 21 is connected to the pre-dopant 12 and the buried layer 11, there can be an enclosed internal space, and the high-voltage device in the internal space can be isolated from the low-voltage device outside the internal space. In addition, the semiconductor device may be, but is not limited to, a high-voltage LDMOS device.

Still refer to FIG. 6. The isolation structure 10 may include a substrate 1 and the epitaxial layer 2. The substrate 1 has a first area and a second area, and the second area is disposed around a periphery of the first area. A buried layer 11 is formed through first ion implantation into the first area, a pre-dopant 12 is formed through second ion implantation into the second area, and a thermal diffusion capability of ions in the pre-dopant 12 is higher than a thermal diffusion capability of ions at the buried layer 11. The epitaxial layer 2 is located on a side, of the substrate 1, on which the buried layer 11 and the pre-dopant 12 are disposed. The deep well (21) is formed, in correspondence to the second area, through third ion implantation into the epitaxial layer 2. The buried layer 11, the pre-dopant 12, and the deep well 21 are sequentially connected, that is, to implement an electrical connection, and the internal area surrounded by the buried layer 11, the pre-dopant 12, and the deep well 21 is the device area.

The substrate 1 is of a first conductivity type. The buried layer 11, the pre-dopant 12, and the deep well 21 are of a second conductivity type. The epitaxial layer 2 is of the first conductivity type or the second conductivity type, where the first conductivity type is contrary to the second conductivity type. In other words, a conductivity type of the substrate 1 may be contrary to a conductivity type of the buried layer 11, the pre-dopant 12, and the deep well 21. A conductivity type of the epitaxial layer 2 may be the same as or contrary to the conductivity type of the substrate 1.

In addition, the pre-dopant 12 on two sides of the buried layer 11 does not need high-energy ion implantation, while the epitaxial layer 2 is thick, and therefore high-energy implantation (within a range allowed by the machine) is needed for ion implantation for extraction by using the deep well. Finally, the deep well, the pre-dopant, and the buried layer may be connected together through thermal annealing.

In addition, to ensure that the thermal diffusion capability of the ions in the pre-dopant 12 is higher than the thermal diffusion capability of the ions at the buried layer 11, types and concentrations of the ions at the buried layer 11 and in the pre-dopant 12 may be, but are not limited to, the following manners.

In a manner 1, the ions at the buried layer 11 are the same as the ions in the pre-dopant 12, and the ion concentration in the pre-dopant 12 is greater than the ion concentration at the buried layer 11. To be specific, a dosage of a dopant for the second ion implantation for forming the pre-dopant 12 is greater than a dosage of a dopant for the first ion implantation for forming the buried layer 11.

In a manner 2, the ions at the buried layer 11 are different from the ions in the pre-dopant 12, the thermal diffusion capability of the ions in the pre-dopant 12 is higher than the thermal diffusion capability of the ions at the buried layer 11, and the ion concentration in the pre-dopant 12 may be greater than the ion concentration at the buried layer 11, or may be less than the ion concentration at the buried layer 11, or may be equal to the ion concentration at the buried layer 11.

To be specific, in an example, a dosage of a dopant for the second ion implantation for forming the pre-dopant 12 may be greater than a dosage of a dopant for the first ion implantation for forming the buried layer 11; in another example, a dosage of a dopant for the second ion implantation for forming the pre-dopant 12 may be less than a dosage of a dopant for the first ion implantation for forming the buried layer 11; or in still another example, a dosage of a dopant for the second ion implantation for forming the pre-dopant 12 may be equal to a dosage of a dopant for the first ion implantation for forming the buried layer 11.

In a manner 3, the ions at the buried layer 11 are different from the ions in the pre-dopant 12, the thermal diffusion capability of the ions in the pre-dopant 12 is lower than the thermal diffusion capability of the ions at the buried layer 11, and the ion concentration in the pre-dopant 12 is greater than the ion concentration at the buried layer 11. To be specific, a dosage of a dopant for the second ion implantation for forming the pre-dopant 12 needs to be greater than a dosage of a dopant for the first ion implantation for forming the buried layer 11.

According to the device isolation structure in this embodiment of this application, the pre-dopant 12 is formed at the periphery of the buried layer 11, and the thermal diffusion capability of ions in the pre-dopant 12 is higher than the thermal diffusion capability of ions at the buried layer 11, so that when the epitaxial layer 2 is thick, after thermal annealing, ions at the buried layer 11, in the pre-dopant 12, and in the deep well 21 are thermally diffused, and therefore the buried layer 11, the pre-dopant 12, and the deep well 21 are sequentially connected. The internal area surrounded by the buried layer 11, the pre-dopant 12, and the deep well 21 is the device area in which, for example, a high-voltage device may be disposed, and a low-voltage device may be disposed on an outer side of the device area. Because the buried layer 11 is successfully extracted through the pre-dopant 12 and the deep well 21, the high-voltage device can be effectively isolated from the low-voltage device with a slight change to an existing process and be well compatible with the existing process, thereby helping reduce processing costs and shorten a manufacturing cycle.

Figure 7:
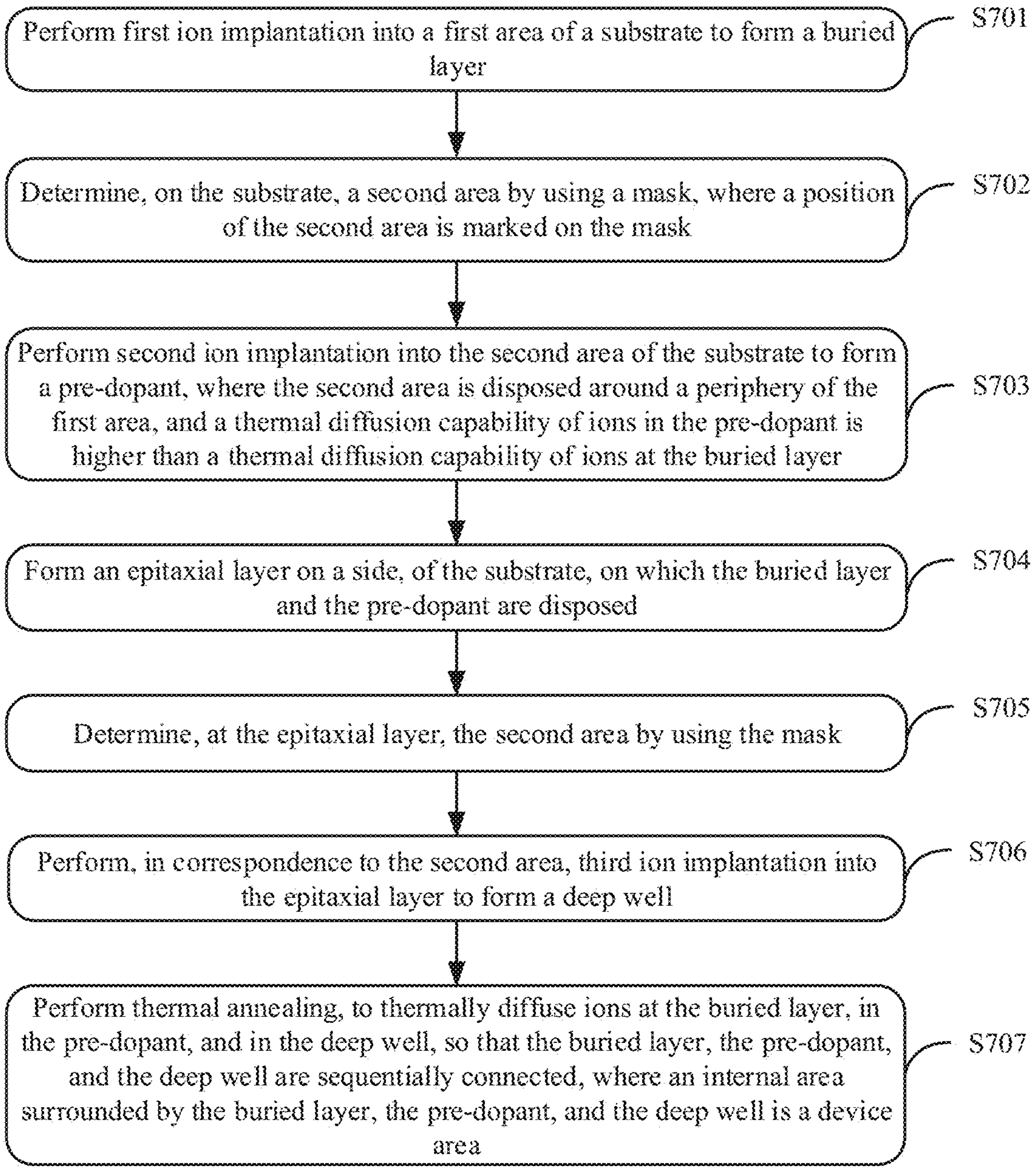
FIG. 7 is a flowchart of a method for manufacturing a device isolation structure in the semiconductor device shown in FIG. 6.
Figure 8:
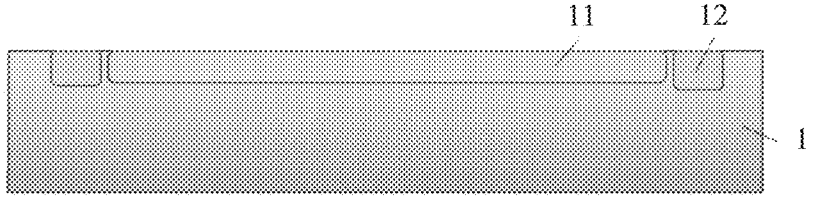
FIG. 8 to FIG. 10 are example diagrams of a specific process of the method for manufacturing the device isolation structure in FIG. 7, where
Figure 9:
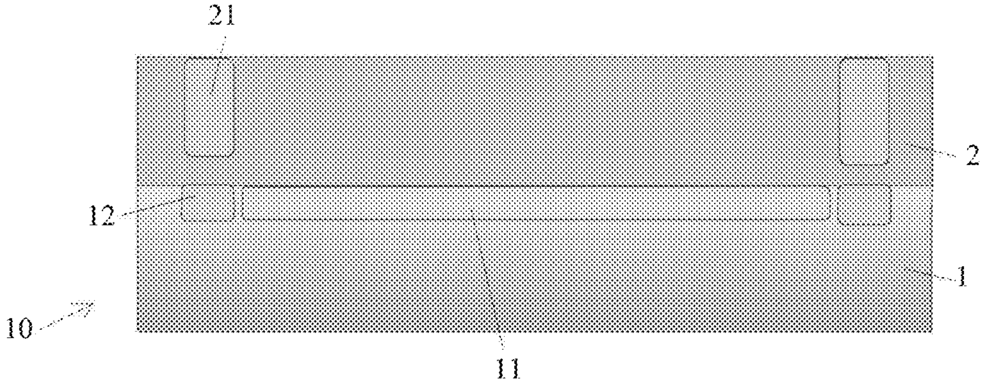
Figure 10:
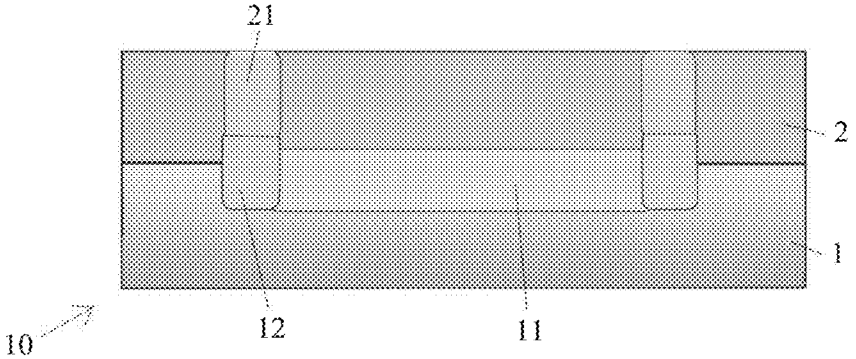

A method for manufacturing the device isolation structure 10 according to this embodiment of this application is described in detail below with reference to FIG. 7 to FIG. 11. FIG. 7 is a flowchart of a method for manufacturing a device isolation structure in the semiconductor device shown in FIG. 6. FIG. 8 to FIG. 10 are example diagrams of a specific process of the method for manufacturing the device isolation structure in FIG. 7. FIG. 9 is a schematic diagram of a sectional view of a structure of the device isolation structure according to an embodiment of this application before thermal annealing; and FIG. 10 is a schematic diagram of a sectional view of a structure of the device isolation structure shown in FIG. 9 after thermal annealing. As shown in FIG. 7, the method for manufacturing the device isolation structure 10 may specifically include the following steps.

S701: Perform first ion implantation into a first area of a substrate 1 to form a buried layer 11.

S703: Perform second ion implantation into a second area of the substrate 1 to form a pre-dopant 12. The second area is disposed around a periphery of the first area, and a thermal diffusion capability of ions in the pre-dopant 12 is higher than a thermal diffusion capability of ions at the buried layer 11.

After the buried layer 11 and the pre-dopant 12 are formed by performing ion implantation twice on the substrate 1, a relationship between positions of the pre-dopant 12 and the buried layer 11 may include, but is not limited to, the following two cases.

In a case 1, the second ion implantation into the second area is performed in a transverse direction at a specified distance from the buried layer 11, to form the pre-dopant 12, as shown in FIG. 8.

The "transverse direction" is a direction from the pre-dopant 12 to the buried layer 11 or from the buried layer 11 to the pre-dopant 12 at a same circumferential position, that is, a radial direction. Because the thermal diffusion capability of the ions in the pre-dopant 12 is higher than the thermal diffusion capability of the ions at the buried layer 11, before thermal annealing, the pre-dopant 12 may be spaced from the buried layer 11 at the specified distance. In this way, a dosage of the second ion implantation can be reduced, and production costs can be reduced. After thermal annealing, the ions in the pre-dopant 12 and the ions at the buried layer 11 are thermally diffused, so that the pre-dopant 12 is connected to the buried layer 11.

In a case 2, the second ion implantation into the second area is performed in a transverse direction in contact with the buried layer 11, to form the pre-dopant 12.

To ensure that the pre-dopant 12 and the buried layer 11 can be reliably connected after thermal annealing, before thermal annealing, the pre-dopant 12 and the buried layer 11 may be in contact with each other, and the pre-dopant 12 and the buried layer 11 may overlap each other as needed.

In addition, to ensure that the thermal diffusion capability of the ions in the pre-dopant 12 is higher than the thermal diffusion capability of the ions at the buried layer 11, types and concentrations of the ions at the buried layer 11 and in the pre-dopant 12 may be, but are not limited to, the following manners.

In a manner 1, the ions at the buried layer 11 are the same as the ions in the pre-dopant 12, and the ion concentration in the pre-dopant 12 is greater than the ion concentration at the buried layer 11.

In a manner 2, the ions at the buried layer 11 are different from the ions in the pre-dopant 12, the thermal diffusion capability of the ions in the pre-dopant 12 is higher than the thermal diffusion capability of the ions at the buried layer 11, and the ion concentration in the pre-dopant 12 is greater than, less than, or equal to the ion concentration at the buried layer 11.

In a manner 3, the ions at the buried layer 11 are different from the ions in the pre-dopant 12, the thermal diffusion capability of the ions in the pre-dopant 12 is lower than the thermal diffusion capability of the ions at the buried layer 11, and the ion concentration in the pre-dopant 12 is greater than the ion concentration at the buried layer 11.

S704: Form an epitaxial layer 2 on a side, of the substrate 1, on which the buried layer 11 and the pre-dopant 12 are disposed.

S706: Perform, in correspondence to the second area, third ion implantation into the epitaxial layer 2 to form a deep well 21.

Because the epitaxial layer 2 is thick, energy of ion implantation for forming the deep well 21 needs to be higher than energy of ion implantation for forming the pre-dopant 12. Therefore, there is a high requirement on a capability of a machine for ion implantation for forming the deep well 21. In addition, after the deep well 21 is formed by performing the third ion implantation, a relationship between positions of the deep well 21 and the pre-dopant 12 may include, but is not limited to, the following two cases.

In a case 1, the third ion implantation into the second area at the epitaxial layer 2 is performed until there is a specified distance from the pre-dopant 12 in a longitudinal direction, to form the deep well 21. That is, there is specified distance between one end, of the deep well 21, facing the pre-dopant 12 and the pre-dopant 12, as shown in FIG. 9.

The "longitudinal direction" is a stacking direction of the substrate 1 and the epitaxial layer 2. Because the thermal diffusion capability of the ions in the pre-dopant 12 is higher than the thermal diffusion capability of the ions at the buried layer 11, before thermal annealing, the deep well 21 may be spaced from the pre-dopant 12 at a specified distance. In this way, when the epitaxial layer 2 is thick, energy for the third ion implantation for forming the deep well 21 can be lower, and an extra high-energy ion implantation machine is not needed. The ion implantation can be implemented by using an existing machine. In addition, a dosage of the third ion implantation can be reduced to some extent, helping reduce production costs. After thermal annealing, the ions in the pre-dopant 12 and the ions in the deep well 21 are thermally diffused, so that the pre-dopant 12 is connected to the deep well 21.

In a case 2, the third ion implantation into the second area at the epitaxial layer 2 is performed until the deep well is contact with the pre-dopant 12 in a longitudinal direction, to form the deep well 21. That is, one end, of the deep well 21, facing the pre-dopant 12 is in contact with the pre-dopant 12.

To ensure that the pre-dopant 12 and the deep well 21 can be reliably connected after thermal annealing, before thermal annealing, the pre-dopant 12 and the deep well 21 may be in contact with each other, and the pre-dopant 12 and the deep well 21 may overlap each other as needed.

S707: Perform thermal annealing, to thermally diffuse ions at the buried layer 11, in the pre-dopant 12, and in the deep well 21, so that the buried layer 11, the pre-dopant 12, and the deep well 21 are sequentially connected, where an internal area surrounded by the buried layer 11, the pre-dopant 12, and the deep well 21 is a device area.

That is, as shown in FIG. 9, before thermal annealing, the pre-dopant 12 and the deep well 21 may be disposed apart in the longitudinal direction; and the buried layer 11 and the pre-dopant 12 may be disposed apart in the transverse direction. As shown in FIG. 10, after thermal annealing, the ions at the buried layer 11, the pre-dopant 12, and the deep well 21 are thermally diffused, so that the buried layer 11, the pre-dopant 12, and the deep well 21 are sequentially connected, that is, an electrical connection is implemented. The internal area surrounded by the buried layer 11, the pre-dopant 12, and the deep well 21 is the device area. Specifically, the pre-dopant 12 is connected to the buried layer 11 mainly in the transverse direction, and the deep well 21 is connected to the pre-dopant 12 mainly in the longitudinal direction.

In addition, in another example, before thermal annealing, the pre-dopant 12 and the deep well 21 may be disposed apart in the longitudinal direction; and the buried layer 11 and the pre-dopant 12 may be disposed in contact with each other in the transverse direction. Alternatively, the pre-dopant 12 and the deep well 21 may be disposed in contact with each other in the longitudinal direction; and the buried layer 11 and the pre-dopant 12 may be disposed apart in the transverse direction. Alternatively, the pre-dopant 12 and the deep well 21 may be disposed in contact with each other in the longitudinal direction; and the buried layer 11 and the pre-dopant 12 may be disposed in contact with each other in the transverse direction.

In addition, the substrate 1 may be a first conductivity type. The buried layer 11, the pre-dopant 12, and the deep well 21 may be of a second conductivity type. The epitaxial layer 2 may be of the first conductivity type or the second conductivity type, where the first conductivity type is contrary to the second conductivity type. In other words, a conductivity type of the substrate 1 may be contrary to a conductivity type of the buried layer 11, the pre-dopant 12, and the deep well 21. A conductivity type of the epitaxial layer 2 may be the same as or contrary to the conductivity type of the substrate 1. For example, the conductivity type of the substrate may be a P type, the conductivity type of the buried layer, the pre-dopant, and the deep well may be an N type, and the conductivity type of the epitaxial layer may be the P type or the N type.

Still refer to FIG. 7, before S703, the method for manufacturing the device isolation structure 10 may further include: S702: Determine, on the substrate 1, the second area by using a mask, where a position of the second area is marked on the mask. Specifically, a first photoresist layer is disposed on the substrate 1, the mask with a target pattern is laid on the first photoresist layer, and exposure and development processes are performed, to form the target pattern on the first photoresist layer and obtain a patterned first photoresist layer. The target pattern includes a shape of the second area, so that the position of the second area is determined on the substrate 1.

Further, before S706, the method for manufacturing the device isolation structure 10 may further include: S705: Determine, at the epitaxial layer 2, the second area by using the mask. Specifically, a second photoresist layer is disposed at the epitaxial layer 2, the mask with a target pattern is laid on the second photoresist layer, and exposure and development processes are performed, to form the target pattern on the second photoresist layer and obtain a patterned second photoresist layer. The target pattern includes the shape of the second area, so that the position of the second area is determined at the epitaxial layer 2.

Because the mask for determining the position of the second area at the epitaxial layer 2 and the mask for determining the position of the second area of the substrate 1 may be the same, that is, ion implantation for forming the deep well 21 may be performed at the epitaxial layer 2 by using the mask, for the implantation for forming the pre-dopant, in correspondence to the pre-dopant 12. In this way, no extra mask and thermal budget costs are required.

Figure 11:
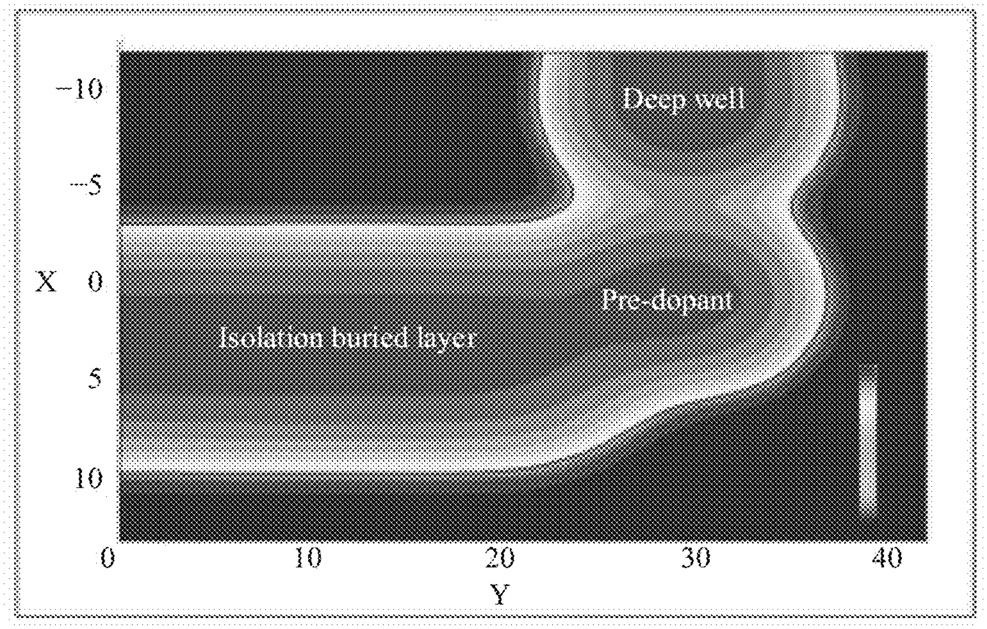
FIG. 11 is a simulation diagram of a TCAD process on the device isolation structure shown in FIG. 9 after thermal annealing.

FIG. 11 is a simulation diagram of a TCAD process on the device isolation structure shown in FIG. 9 after thermal annealing. As shown in FIG. 11, feasibility of the method for manufacturing the device isolation structure according to embodiments of this application is verified through simulation of the TCAD device process. Specifically, an epitaxial thickness of 12 μm (an existing conventional epitaxial thickness is 8 μm) is used as an example to maintain a same condition for implantation for forming an isolation buried layer and thermal annealing. For example, the ion implantation may be completed by using an existing machine without higher ion implantation energy at an extraction position, thereby avoiding adding an extra high-energy ion implantation machine. It can be learned from impurity distribution after annealing shown in FIG. 11 that the buried layer is smoothly extracted.

The method for manufacturing the device isolation structure disposed in embodiments of this application is mainly related to a process method for extracting a deep isolation buried layer, to smoothly extract the deep buried layer beneath a thick epitaxial layer and effectively isolate a device. In addition, the process method for extracting the deep isolation buried layer is compatible with a current process capability, does not need an extra high-energy ion implantation machine, and does not need an extra mask, epitaxy process, or the like. Compared with the solution shown in FIG. 2, only one additional step of ion implantation for forming a pre-dopant is needed, a mask for ion implantation for forming a deep well may be reused, and thermal annealing on a buried layer and the deep well may be shared, so that there is no extra mask and thermal budget. Compared with the solution shown in FIG. 4, a plurality of times of epitaxial growth and implantation are not needed, so that costs and process complexity are greatly reduced. Compared with the solution shown in FIG. 5, a buried layer is extracted through ion implantation, so that not only costs are reduced, process stability is improved, but a contact problem caused by a hollow due to metal deposition is eliminated. In other words, the process method for extracting a deep isolation buried layer in embodiments of this application has a slight change to an existing process, is well compatible with the existing process, and can ensure processing quality, thereby helping reduce processing costs and shorten a manufacturing cycle.

In conclusion, the method for extracting a deep isolation buried layer of a device in embodiments of this application may specifically include the following steps.

(1) First, ion implantation is performed on a substrate to form a buried layer.

(2) Ion implantation of a same type as that for forming the buried layer is performed to form a pre-dopant, and a position is on an outer side of the buried layer.

(3) After epitaxy, high-energy ion implantation, of the same type as that for forming the buried layer, for forming a deep well for extraction is performed, where a same mask is used for the pre-dopant and the ion implantation for forming the deep well. In addition, element types of the pre-dopant, the ion implantation for forming the deep well, and the buried layer are the same, for example, are of an N type or a P type, and may be, but are not limited to, a same type of element.

(4) Through thermal annealing, the buried layer, the pre-dopant, and the ion implantation for forming the deep well may be connected together after diffusion, to extract the buried layer, where positions of the pre-dopant layer and the buried layer may overlap, or may be spaced, but it needs to be ensured that the pre-dopant and the buried layer may be connected after thermal annealing; implantation energy also needs to be ensured to ensure that the deep well and the pre-dopant may be connected after annealing; and a thermal annealing temperature and duration needs to be ensured to ensure that the buried layer, pre-dopant, and deep well are connected together.

In other words, ion implantation may be first performed on a substrate 1 of a device to form a buried layer 11, and ion implantation is then performed on an outer side of the buried layer 11 to form a pre-dopant 12. Because a surface is silicon, ion implantation with high energy is not needed. Then, after an epitaxial layer 2 is generated on the device, ion implantation, of a same element type as that for forming the pre-dopant implantation, for forming a deep well is performed at the epitaxial layer 2 by using a mask for the pre-dopant implantation, and an implantation depth depends on a capability of a machine. Finally, thermal annealing is performed, and impurities implanted into a deepest area of the buried layer 11, the pre-dopant 12, and the deep well 21 are thermally diffused. Lateral diffusion of the buried layer 11 and the pre-dopant 12 may be in contact, and longitudinal diffusion of the deep well 21 and the pre-dopant 12 may further be in contact. Therefore, the buried layer, the pre-dopant, and the deep well may be connected together. In this way, the isolation buried layer of the device can be extracted.

As the pre-dopant 12 is formed at the periphery of the buried layer 11, and the thermal diffusion capability of ions in the pre-dopant 12 is higher than the thermal diffusion capability of ions at the buried layer 11, when the epitaxial layer 2 is thick, after thermal annealing, ions at the buried layer 11, in the pre-dopant 12, and in the deep well 21 are thermally diffused. Therefore, the buried layer 11, the pre-dopant 12, and the deep well 21 are sequentially connected, and the buried layer 11 can be smoothly extracted. In other words, in embodiments of this application, a problem that the isolation buried layer 11 cannot be extracted because the epitaxial layer 2 is excessively thick may be resolved, and the deep isolation buried layer 11 may be extracted with a same capability of a machine, so that a capability of an existing process platform may be perfectly compatible. In addition, no extra mask is needed, so that costs are reduced. In addition, the method may be extensively applied, and is applicable to various devices in which an isolation buried layer beneath the epitaxial layer needs to be extracted.

At last, it should be noted that the embodiments described above are merely intended for describing the technical solutions of this application, but not for limiting this application. Although this application is described in detail with reference to the foregoing embodiments, a person of ordinary skill in the art should understand that modifications can still be made to the technical solutions described in the foregoing embodiments or equivalent replacements can still be made to some technical features thereof, without departing from the scope of the technical solutions of embodiments of this application.

What is claimed is:

1. A method for manufacturing a device isolation structure, comprising:

performing first ion implantation into a first area of a substrate to form a buried layer;

performing second ion implantation into a second area of the substrate to form a pre-dopant, wherein the second area is disposed around a periphery of the first area, and a thermal diffusion capability of ions in the pre-dopant is higher than a thermal diffusion capability of ions at the buried layer;

forming an epitaxial layer on a side, of the substrate, on which the buried layer and the pre-dopant are disposed;

performing, in correspondence to the second area, third ion implantation into the epitaxial layer to form a deep well; and performing thermal annealing to thermally diffuse ions at the buried layer, in the pre-dopant, and in the deep well, wherein the buried layer, the pre-dopant, and the deep well are sequentially connected, wherein an internal area surrounded by the buried layer, the pre-dopant, and the deep well is a device area.

2. The method for manufacturing a device isolation structure according to claim 1, wherein:

the ions at the buried layer are the same as the ions in the pre-dopant, and an ion concentration in the pre-dopant is greater than an ion concentration at the buried layer; or the ions at the buried layer are different from the ions in the pre-dopant, wherein the thermal diffusion capability of the ions in the pre-dopant is higher than the thermal diffusion capability of the ions at the buried layer, and an ion concentration in the pre-dopant is greater than, less than, or equal to an ion concentration at the buried layer; or the thermal diffusion capability of the ions in the pre-dopant is lower than the thermal diffusion capability of the ions at the buried layer, and an ion concentration in the pre-dopant is greater than an ion concentration at the buried layer.

3. The method for manufacturing a device isolation structure according to claim 1, wherein before the step of performing the second ion implantation into the second area of the substrate to form the pre-dopant, the method further comprises:

determining, on the substrate, the second area by using a mask, wherein a position of the second area is marked on the mask.

4. The method for manufacturing a device isolation structure according to claim 3, wherein before the step of performing, in correspondence to the second area, the third ion implantation into the epitaxial layer to form the deep well, the method further comprises:

determining, at the epitaxial layer, the second area by using the mask.

5. The method for manufacturing a device isolation structure according to claim 1, wherein performing the second ion implantation into the second area of the substrate to form the pre-dopant comprises:

performing, in a transverse direction at a specified distance from the buried layer, the second ion implantation into the second area to form the pre-dopant; or performing, in a transverse direction in contact with the buried layer, the second ion implantation into the second area to form the pre-dopant.

6. The method for manufacturing a device isolation structure according to claim 1, wherein performing, in correspondence to the second area, the third ion implantation into the epitaxial layer to form the deep well comprises:

performing the third ion implantation into the second area at the epitaxial layer until there is a specified distance from the pre-dopant in a longitudinal direction, to form the deep well; or performing the third ion implantation into the second area at the epitaxial layer until the deep well is in contact with the pre-dopant in a longitudinal direction, to form the deep well.

7. The method for manufacturing a device isolation structure according to claim 5, wherein that the buried layer, the pre-dopant, and the deep well are sequentially connected comprises:

connecting the pre-dopant to the buried layer in the transverse direction; and connecting the deep well and the pre-dopant in the longitudinal direction.

8. The method for manufacturing a device isolation structure according to claim 1, wherein:

the substrate is of a first conductivity type, the buried layer, the pre-dopant, and the deep well are of a second conductivity type, and the epitaxial layer is of the first conductivity type or the second conductivity type, wherein the first conductivity type is contrary to the second conductivity type.

9. A device isolation structure, comprising:

a substrate, having a first area and a second area, wherein:

the second area is disposed around a periphery of the first area; and a buried layer is formed through first ion implantation into the first area, a pre-dopant is formed through second ion implantation into the second area, and a thermal diffusion capability of ions in the pre-dopant is higher than a thermal diffusion capability of ions at the buried layer; and an epitaxial layer located on a side, of the substrate, on which the buried layer and the pre-dopant are disposed, wherein a deep well is formed, in correspondence to the second area, through third ion implantation into the epitaxial layer, wherein the buried layer, the pre-dopant, and the deep well are sequentially connected, and an internal area surrounded by the buried layer, the pre-dopant, and the deep well is a device area.

10. The device isolation structure according to claim 9, wherein:

the ions at the buried layer are the same as the ions in the pre-dopant, and an ion concentration in the pre-dopant is greater than an ion concentration at the buried layer; or the ions at the buried layer are different from the ions in the pre-dopant, wherein the thermal diffusion capability of the ions in the pre-dopant is higher than the thermal diffusion capability of the ions at the buried layer, and an ion concentration in the pre-dopant is greater than, less than, or equal to an ion concentration at the buried layer; or the thermal diffusion capability of the ions in the pre-dopant is lower than the thermal diffusion capability of the ions at the buried layer, and an ion concentration in the pre-dopant is greater than an ion concentration at the buried layer.

11. The device isolation structure according to claim 9, wherein at least one set of the following two sets of factors are satisfied:

the substrate is of a first conductivity type, the buried layer, the pre-dopant, and the deep well are of a second conductivity type, and the epitaxial layer is of the first conductivity type or the second conductivity type, wherein the first conductivity type is contrary to the second conductivity type; or the buried layer, the pre-dopant, and the deep well are disposed as follows: before thermal annealing, the pre-dopant and the deep well are disposed apart or in contact in a longitudinal direction, and the buried layer and the pre-dopant are disposed apart or in contact in a transverse direction; and after thermal annealing, ions at the buried layer, in the pre-dopant, and in the deep well are thermally diffused, wherein the pre-dopant is connected to the buried layer in the transverse direction, and the deep well is connected to the pre-dopant in the longitudinal direction.

12. A semiconductor device, comprising:

a device isolation structure, wherein the device isolation structure comprises:

a substrate having a first area and a second area, wherein:

the second area is disposed around a periphery of the first area; and a buried layer is formed through first ion implantation into the first area, a pre-dopant is formed through second ion implantation into the second area, and a thermal diffusion capability of ions in the pre-dopant is higher than a thermal diffusion capability of ions at the buried layer; and an epitaxial layer located on a side, of the substrate, on which the buried layer and the pre-dopant are disposed, wherein a deep well is formed, in correspondence to the second area, through third ion implantation into the epitaxial layer, wherein the buried layer, the pre-dopant, and the deep well are sequentially connected, and an internal area surrounded by the buried layer, the pre-dopant, and the deep well is a device area;

a high-voltage device disposed in a device area of the device isolation structure; and a low-voltage device disposed at the epitaxial layer and located on an outer side of the device area.

13. The semiconductor device according to claim 12, wherein:

the ions at the buried layer are the same as the ions in the pre-dopant, and an ion concentration in the pre-dopant is greater than an ion concentration at the buried layer; or the ions at the buried layer are different from the ions in the pre-dopant, wherein the thermal diffusion capability of the ions in the pre-dopant is higher than the thermal diffusion capability of the ions at the buried layer, and an ion concentration in the pre-dopant is greater than, less than, or equal to an ion concentration at the buried layer; or the thermal diffusion capability of the ions in the pre-dopant is lower than the thermal diffusion capability of the ions at the buried layer, and an ion concentration in the pre-dopant is greater than an ion concentration at the buried layer.

14. The semiconductor device according to claim 12, wherein at least one set of the following two sets of factors are satisfied:

the substrate is of a first conductivity type, the buried layer, the pre-dopant, and the deep well are of a second conductivity type, and the epitaxial layer is of the first conductivity type or the second conductivity type, wherein the first conductivity type is contrary to the second conductivity type; or the buried layer, the pre-dopant, and the deep well are disposed as follows: before thermal annealing, the pre-dopant and the deep well are disposed apart or in contact in a longitudinal direction, and the buried layer and the pre-dopant are disposed apart or in contact in a transverse direction; and after thermal annealing, ions at the buried layer, in the pre-dopant, and in the deep well are thermally diffused, wherein the pre-dopant is connected to the buried layer in the transverse direction, and the deep well is connected to the pre-dopant in the longitudinal direction.

* * * * *